(12) United States Patent
Woodard et al.

(10) Patent No.: US 6,204,480 B1
(45) Date of Patent: Mar. 20, 2001

(54) VACUUM DEPOSITION OF BUS BARS ONTO CONDUCTIVE TRANSPARENT FILMS

(75) Inventors: Floyd E. Woodard, San Jose; Reto Furler, Alameda, both of CA (US)

(73) Assignee: Southwall Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/495,464

(22) Filed: Feb. 1, 2000

(51) Int. Cl.$^7$ .................................................... B60L 1/02
(52) U.S. Cl. ........................ 219/203; 219/219; 219/541
(58) Field of Search ............................ 219/203, 528, 219/549, 543, 509, 522, 541; 204/192.26; 427/165, 108; 428/215, 209, 210; 338/309, 308; 392/439; 52/171.2; 65/42, 55, 60.2; 156/166, 301.1

(56) References Cited

U.S. PATENT DOCUMENTS

| | | | |
|---|---|---|---|
| 3,790,752 | * | 2/1974 | Boaz et al. ............................ 219/522 |
| 3,833,451 | * | 9/1974 | Wagner ................................... 428/67 |
| 4,011,087 | * | 3/1977 | Short ................................... 106/1.13 |
| 4,057,671 | * | 11/1977 | Shoop ................................... 428/208 |
| 4,204,942 | * | 5/1980 | Chahroudi ....................... 204/298.07 |
| 4,284,677 | * | 8/1981 | Herliczek ............................ 428/192 |
| 4,298,444 | * | 11/1981 | Chahroudi ....................... 204/192.14 |
| 4,337,990 | * | 7/1982 | Fan et al. ............................ 359/360 |
| 4,361,751 | * | 11/1982 | Criss et al. ........................... 219/522 |
| 4,499,745 | * | 2/1985 | Ricouard et al. ....................... 70/285 |
| 4,543,466 | * | 9/1985 | Ramus ................................... 219/203 |
| 4,593,175 | * | 6/1986 | Bowser et al. ....................... 219/203 |
| 4,725,710 | * | 2/1988 | Ramus et al. ....................... 219/203 |
| 4,820,902 | * | 4/1989 | Gillery ................................. 219/203 |
| 4,940,884 | * | 7/1990 | Gillery ................................. 219/203 |
| 4,943,140 | * | 7/1990 | Woodard et al. ..................... 359/585 |
| 4,952,783 | * | 8/1990 | Aufderheide et al. ............... 219/528 |
| 4,976,503 | * | 12/1990 | Woodard ............................. 359/360 |
| 5,070,230 | * | 12/1991 | Osada et al. ......................... 219/203 |
| 5,089,687 | * | 2/1992 | Bartrug et al. ....................... 219/203 |
| 5,128,513 | * | 7/1992 | Byars et al. .......................... 219/203 |
| 5,270,517 | * | 12/1993 | Finley ................................... 219/203 |
| 5,414,240 | * | 5/1995 | Carter et al. ......................... 219/203 |
| 5,448,037 | * | 9/1995 | Takase et al. ......................... 219/547 |
| 5,510,173 | * | 4/1996 | Pass et al. ............................ 428/216 |
| 6,014,840 | * | 1/2000 | Ray et al. ............................... 49/413 |

\* cited by examiner

*Primary Examiner*—Tu Ba Hoang
(74) *Attorney, Agent, or Firm*—Burns, Doane, Swecker & Mathis, LLP

(57) ABSTRACT

Vacuum deposition processes such as sputter-depositing are employed to deposit electrically conductive bus bars onto thin film transparent conductor sheets. These assemblies provide efficient and durable electrical connections to the conductor sheets which can be laminated into glazing structures such as automotive windshields to provide resistance heating for defogging and deicing or the provide an electrical connection for in-window antennas and in window radiation shields.

40 Claims, 5 Drawing Sheets

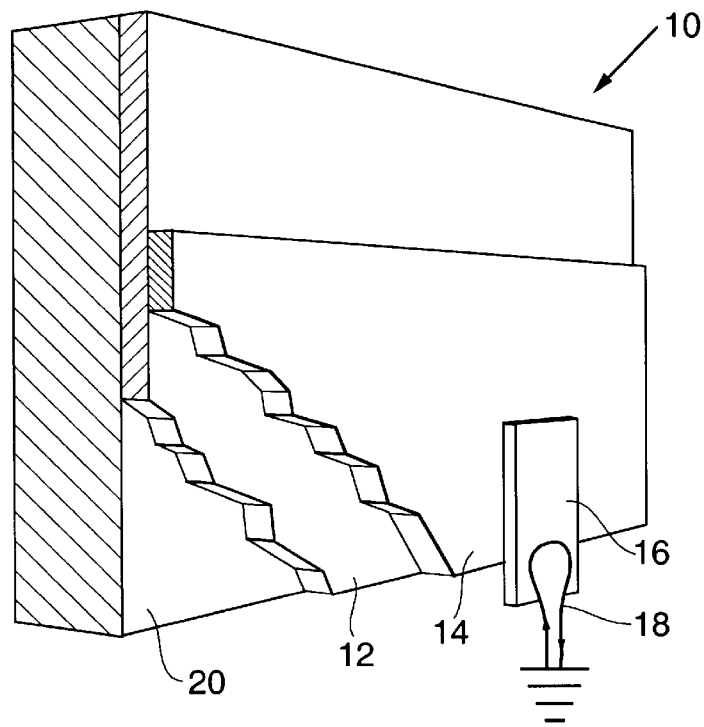
FIG. 1
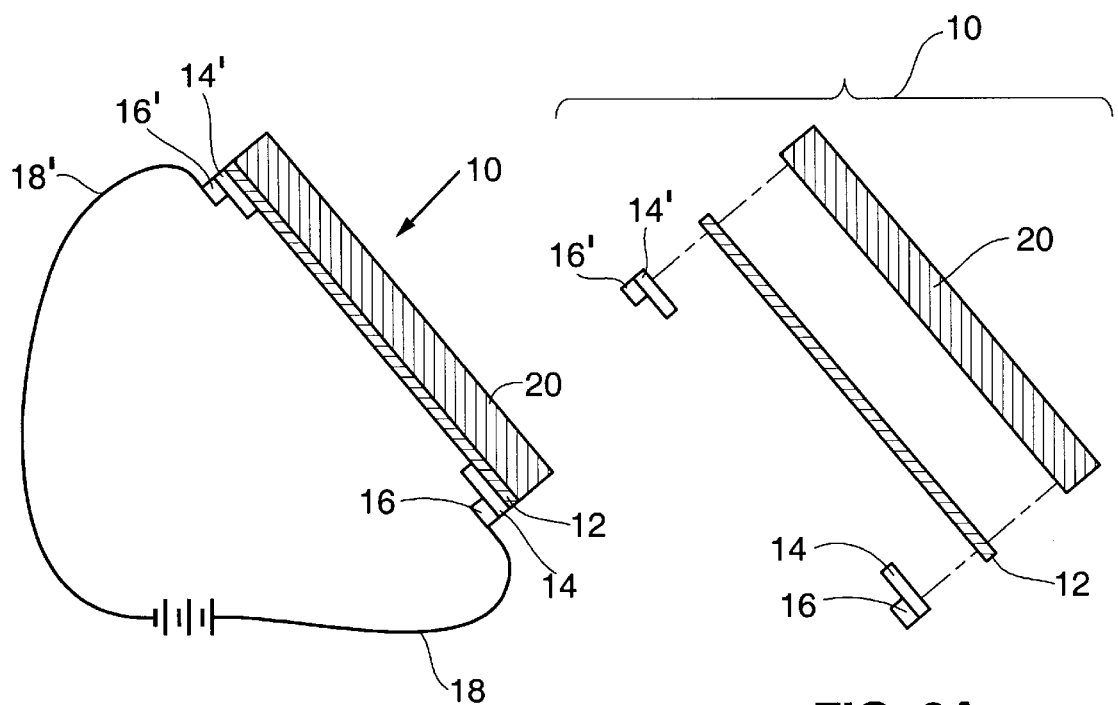
FIG. 2  FIG. 2A

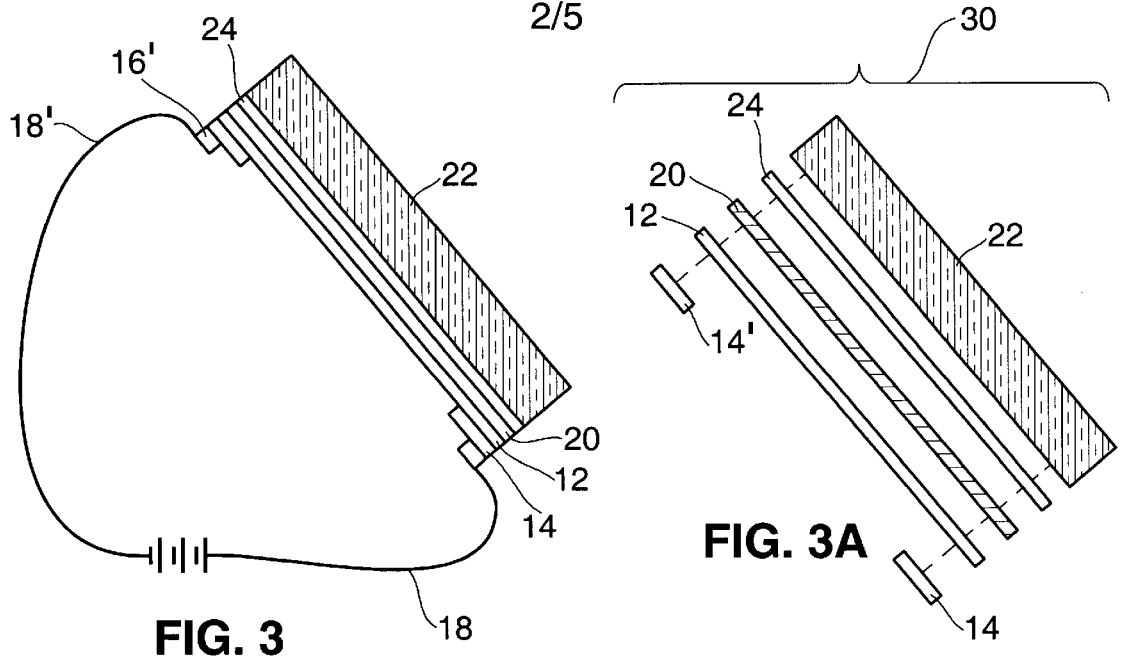
FIG. 3
FIG. 3A
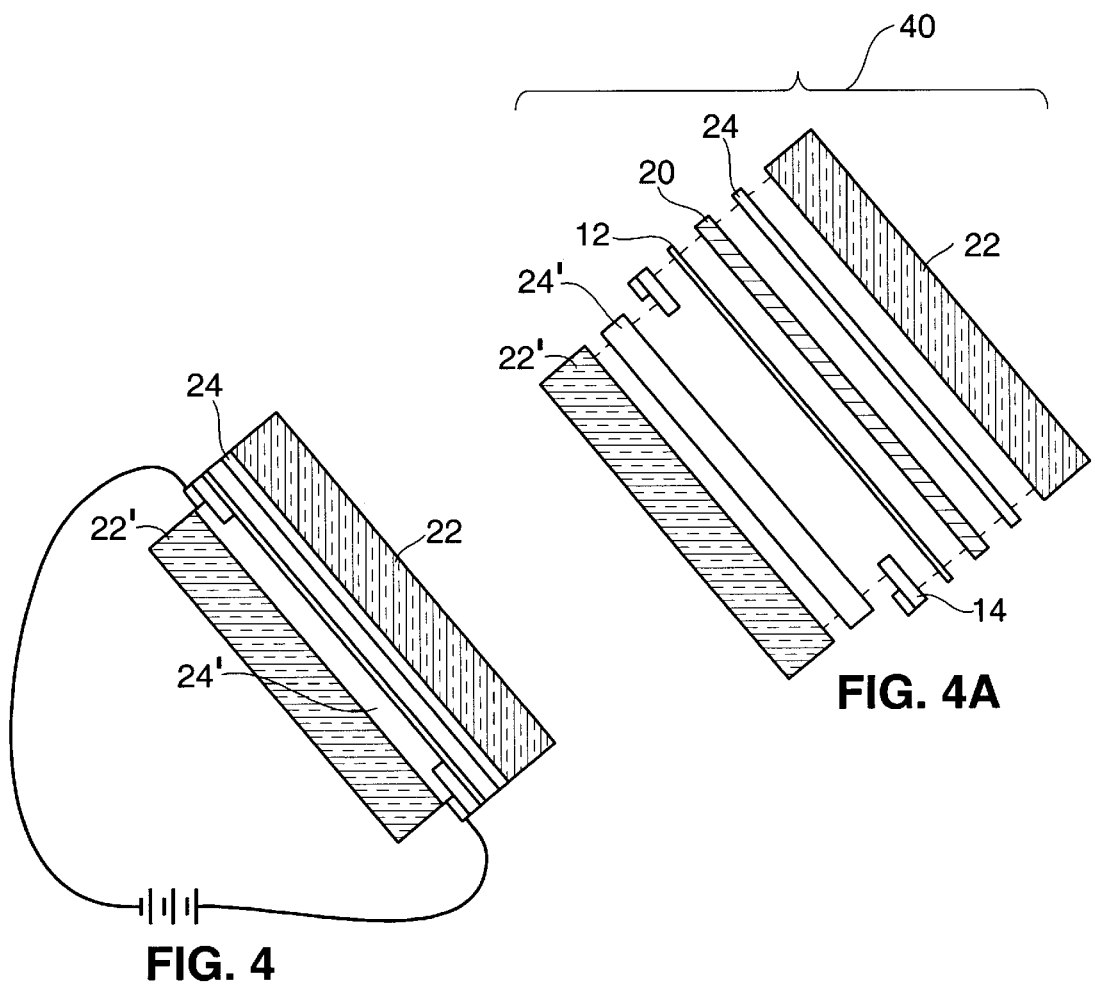
FIG. 4
FIG. 4A

VACUUM DEPOSITION OF BUS BARS ONTO CONDUCTIVE TRANSPARENT FILMS

BACKGROUND OF THE INVENTION

1. Field of the Invention

This invention relates to electrically conductive transparent panels and to bus bars which make electrical contact with them. These transparent panels can take the form of window glazings, particularly vehicle windshields and the like. The electrical bus bars can be used to allow a powering current to be delivered to the panel to heat the panel such as for deicing or defogging a vehicle windshield. They also can be used to permit an electromagnetic signal, such as a radio signal, detected by the panel to be electrically transmitted from the panel.

2. Background Information

There are numerous applications where it is desired to have a transparent panel containing an electrically conductive element which is connected to an electrical circuit. Three very common applications of this sort are 1. vehicle window glazings which have conductive elements for providing electric heat to the windows to melt ice or defog; 2. vehicle window glazings which have conductive elements as antennas for radios and the like; and 3. architectural and vehicular window glazings which provide electromagnetic radiation shielding. There is a growing interest in these electrically conductive layer-carrying glazing products in the automotive field. There, the needs for increased automotive efficiency and streamlining call for more gently sloped, larger area windows and "in glass" antennas. There is also a need to provide deicing and defogging of these window surfaces, particularly because modern cars are expected to operate with their windows closed for safety and efficiency reasons.

One approach to providing conductive elements in transparent panels, such as window glazings, has been to apply fine wires to the surface of the panel or to imbed such wires in the panels or between multiple panels and to make an electrical connection to the wires. A second approach has been to apply over at least a substantial portion of the transparent surface a thin film coating which is electrically conductive and which, because of its thinness and/or its chemical make up, is itself substantially transparent. In this case, an electrical connection must be made to the conductive thin film. It is this second approach to which this invention relates.

The structures which effect the electrical connection to the thin film conductive elements are often referred to as "bus bars". They are often patterned to achieve proper current distribution or to focus heating into certain regions in the case of heated windows and the like. Several methods and materials have been used heretofore to make these electrical connections. One common type of connection is a silk-screened layer of conductive ink or paint such as a silver epoxy which is thermally cured. Another conventional type of bus bar employs conductive tapes and foils in contact with the conductive layer. In both of these settings it is common to laminate the resulting conductive layer-bus bar assembly into a glazing structure with poly(vinylbutyral) (PVB).

Both of these methods gave poor results. After lamination, the bus to bus resistance increases significantly. It is not clear if the increase in bus to bus resistance is a result of degradation of the electrical contact between the bus bar and the transparent conductor or if it is a result of cracking in the transparent conductor in the vicinity of the bus bar which might be caused by physical stress caused by uneven pressure applied through the relatively thick bus bar to the film during lamination. Whatever the failure mechanism of these conventional assemblies, when bus bars of the present invention were used, the bus to bus resistance did not increase signigicantly during the lamination cycle.

Conductive enamel frits have been tried as electrical conductors. The materials are brittle and require high temperature firing which can disturb delicate conductive elements. Electrodeposition of conductive connectors has also been used but has the disadvantage of employing wet chemistry which is typically different than and not particularly compatible with the other processes employed in the production of the conductive thin films.

There is a substantial body of information available concerning the application of electrically conductive layers to windows and other transparent panels. Representative descriptions can be found in the following United States patents:

U.S. Pat. No. 5,089,687 to PPG (Feb. 18, 1992)
  Covers using dual leads connecting to a bus bar. This provides at least partial insurance against electrical failure of one of the leads.

U.S. Pat. No. 5,448,037 to Mitsui Toatsu Chemicals Inc. (Sep. 5, 1995)
  A transparent heater is described in which the heating element (i.e. a transparent conductive film) is deposited by a dry process (e.g. sputtering, ion plating, CVD, etc.) and the electrodes are deposited by a wet plating method.

U.S. Pat. No. 5,070,230 to Ashai Glass (Dec. 3, 1991)
  A colored layer (e.g. ceramic color print) is applied at the peripheral portion of an electrically heated windshield. The bus bar is formed on that colored layer.

U.S. Pat. No. 4,593,175 to PPG (Jun. 3, 1986)
  A braided composite lead for an electrically heated insulated glass unit has the spaces between the braided wires filled with a substantially moisture impervious material to minimize water vapor penetration into the insulating air space.

U.S. Pat. No. 4,284,677 to Libbey Owens Ford (Aug. 18, 1981)
  An electrically heated laminated aircraft glazing in disclosed in which the bus bar is covered with a thin layer of poly(isobutylene) resin containing carbon black. A second similar poly(isobutylene) resin layer is disposed over an extended portion of one glass sheet. In both cases the resin layer is next to a plastic interlayer. The purpose of these layers is to prevent delamination and cold chipping of the glazing with subsequent moisture ingress and bus bar failure.

U.S. Pat. No. 3,833,451 to PPG (Sep. 3, 1974)
  A laminated electrically heated windshield is shown having accordion-folded bus bars making surface to surface contact with a transparent electroconductive film. This shape of the bus bar is to insure sliding contact between the bus bars and the film when the glass panel and the bus bar expand at different rates.

U.S. Pat. No. 3,790,752 to Ford Motor Company (Feb. 5, 1974)
  A heatable windshield is disclosed having a notch for inserting a circuit board which connects to the internal heating element. A means for sealing the notch during lamination is also shown. The connection to the conductive coating is completely sealed so that moisture is unable to penetrate the laminated construction.

U.S. Pat. No. 4,011,087 to Du Pont (Mar. 8, 1977)

A metallizing composition is described which is useful for printing metal patterns on glass substrates to make heaters. The compositions contain silver particles covered with silver halide. These compositions are more resistant to sulfur attack. They are useful for making demisters on automobile windshields.

U.S. Pat. No. 4,725,710 to Ford Motor Company (Feb. 16, 1988)

An electrically heated vision unit is shown in which the bus bar has a wide portion and a narrow portion. The wide portion is more conductive and thus the zone between the two wide regions conducts more current and is selectively heated.

U.S. Pat. No. 4,057,671 to PPG (Nov. 8, 1977)

A transparent electrically conductive window with self-soldering bus bars is set forth. The bus bars contain particles of finely divided electroconductive metal (e.g. silver) dispersed with a metal alloy having a fusion point between 70° C. and 150° C. The soldering happens during the lamination cycle.

U.S. Pat. No. 4,940,884 to PPG Industries (Jul. 10, 1990)

A heated transparency is provided with greater reliability by providing dual electrical connections to the bus bar that is opposite the edge which is attached to the power source.

U.S. Pat. No. 4,820,902 to PPG Industries (Apr. 11, 1989)

A pair of electroconductive extensions extend from the a bus bar in a heated windshield. The extensions reduce power loss in the bus bar and provide redundancy should one of the extensions fail.

U.S. Pat. No. 5,414,240 to PPG Industries (May 9, 1995)

An electrically heatable windshield with a hidden bus bar configuration is described. A border of opaque ceramic material, preferably a lead borosilicate enamel, is bonded to an interior surface of the transparency along its periphery. Opposing electroconductive bus bars, preferably a low frit content silver-containing ceramic material, are bonded to the ceramic material so that the entire inner edge of the bus bar overlays a portion of the ceramic material.

U.S. Pat. No. 4,543,466 to Ford Motor Company (Sep. 24, 1985)

A trapezoidal-shaped electrically heated windshield has, at top and bottom edges, bus bars of uniform conductivity through out their length. The upper bus bar runs the full length of the conductive coating which makes up the windshield heating element. The lower contact is symmetrically located along the lower edge of the conductive coating and has a length equal to the sum of the length of the upper bus bar and generally about one-half the difference between the entire effective length of the lower edge coating minus the length of the line of contact of the upper bus bar.

U.S. Pat. No. 4,976,503 to Monsanto Company (Dec. 11, 1990)

A gradient band is described in an electrically heated windshield. It is formed by thickening one of the metal layers in the transparent conductor (i.e. an interference filter). Plural bus bars run substantially parallel to the gradient band at the top and bottom of a windshield.

U.S. Pat. No. 4,943,140 to Monsanto Company (Jul. 24, 1990)

A gradient band for automobile windshields is described which is a continuation of one of the metal layer in an interference coating which is generally provided for solar control or electrical heating. Also included is a layer (e.g. NiCr) added to suppress luminous reflection within the vehicle.

STATEMENT OF THE INVENTION

Objects of this invention are to provide more convenient and more effective processes for applying bus bars to transparent electroconductive coatings and to provide the bus bar—conductive layer assemblies which result from the process. These bus bars may be the primary connection between the electroconductive thin film and the electrical circuit or they can function as feeder electrodes assuring an intimate low resistance electrical connection between the thin film and another primary electrical connection.

In preferred embodiments it is an object to provide methods for depositing bus bars on conductive layers and creating bus bar—conductive layer assemblies which work well with conductive layers on flexible plastic substrates and provide bus bars which are compatible with such substrates. In this preferred setting, the transparent conductive film can be processed in a web or roll format. In this setting the bus bars can run in either cross web or down web directions. The flexible substrate carrying the conductive coating—bus bar assembly may subsequently be encapsulated within the interlayer of a safety laminated glass construct as used in an automobile windshield.

It is a further object to provide bus bar—conductive layer assemblies which may be used in a so called "bilayer structure" which involves a single glass panel, a plastic film inner layer carrying the bus bar—conductive layer assembly and a tough polymer skin.

In these settings it is necessary that the bus bar in the bus bar conductive layer assembly maintains electrical connection to the transparent conductor after going through subsequent processing steps such as an autoclave lamination cycle. In addition, the bus bar must not adversely affect the mechanical integrity of the window structure as often occurs with conventional bus bars. It is an object to provide bus bars which are compatible with all of these use and processing conditions.

It is a further object of this invention to provide a process and products in which the shape and cross web location of the bus bar may be easily varied. Furthermore, it is desired that the conductivity of the bus bars may be graded to achieve varied conductance paths which are useful in providing zoned heating in heated vehicle glazing structures and the like.

We have now found that these objects are achieved when bus bars are applied to thin film transparent conductors using vacuum deposition techniques such as ion vapor deposition, chemical vapor deposition (evaporation), ion plating, plasma vapor deposition and especially sputtering. The long term effectiveness of sputter-deposited bus bars has been demonstrated. Conductive layers carrying sputter-deposited silver bus bars and laminated into glazing structures have been powered at 1.1 to 1.5 $W/in^2$ for two weeks and longer with no change in the optical and electrical properties of the laminate.

Thus, in one aspect this invention provides an improved transparent panel that includes a transparent electrically conductive layer connected through an electrical contact bus bar to an external electrical circuit. In this aspect, the improvement involves using a vacuum-deposited metal bus bar as the electrical contact—either as the primary contact or as a feeder electrode.

In an additional aspect this invention provides an improved window glazing unit containing a transparent electrically conductive thin film electrical resistance heating layer connected through an electrical contact to an electrical power source. In this aspect, the improvement also involves using a vacuum-deposited metal bus bar as the electrical contact to the thin film.

In a third aspect this invention provides window glazing structures, such as vehicular window glazings, having a sheet of rigid glazing material carrying or laminated to a transparent electrically conductive layer connected through an electrical contact to an external electrical circuit, in which the electrical contact is a vacuum-deposited metal bus bar. Optionally, a second sheet of rigid glazing material may be laminated over the conductive layer.

In a fourth aspect this invention provides an improved transparent panel that includes a transparent electrically conductive layer connected through an electrical contact to an external electrical circuit. In this aspect, the improvement involves using a vacuum-deposited metal bus bar which has a varied or tapered, graduated cross-section as the electrical contact.

In each case, this invention provides the methods for making these structures with these vacuum-deposited bus bars as well as the structures themselves.

DETAILED DESCRIPTION OF THE INVENTION

BRIEF DESCRIPTION OF THE DRAWINGS

This invention will be further described with reference being made to the accompanying drawings, none of which are to scale and all of which are schematic in nature. In these drawings:

FIG. 1 is acut away, perspective view of a transparent panel with a conductive sheet and a vacuum-deposited bus bar of this invention;

FIG. 2 is a side view of a transparent panel employing bus bars of this invention connected into an electrical circuit and FIG. 2A is a blown-up view of the same structure.

FIG. 3 is a side view of another panel employing the bus bars of this invention connected into an electrical circuit and FIG. 3A is a blown-up view of the same structure.

FIG. 4 is a side view of another panel employing the bus bars of this invention connected into an electrical circuit and FIG. 4A is a blown-up view of the same structure.

DESCRIPTION OF PREFERRED EMBODIMENTS

Figure 5:
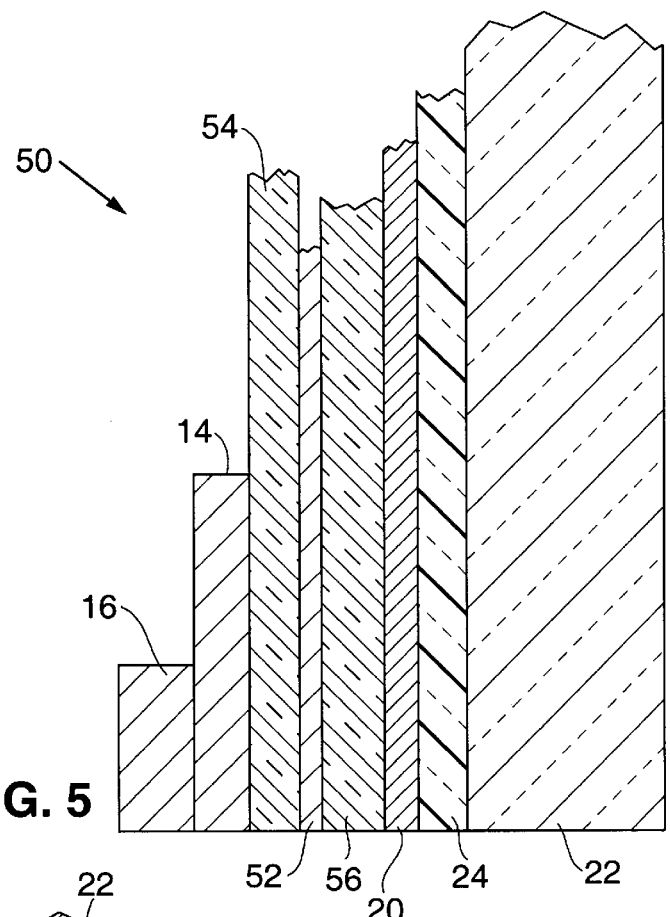
FIG. 5 is a cross-sectional side view of a transparent panel employing the vacuum-deposited bus bars of this invention.

This Description of Preferred Embodiments is presented in the following sections:

Definitions
Transparent Panel Structures
  Conductive Layers
  Bus Bars
    Shaped Bus Bars
    Graduated Bus Bars
  Substrates
  Overall Structures
Processes for Production Definitions As used in this specification and the appended claims, the following terms have defined meanings:

"Visible radiation" or "light" means electromagnetic radiation having a wavelength of from 380 nanometers to 750 nanometers. (CIE Standard)

"Infrared radiation" or "heat" means electromagnetic radiation having a wavelength above 750 nanometers.

"Transparent" means having the property of transmitting visible radiation and especially having the property of transmitting at least about 30% of visible radiation.

Materials in the conductive layer referred to as "dielectrics" are inorganic compounds, typically metal oxides, nitrides or sulfides. The term "dielectric" might imply that these materials are electrical insulators. However, depending upon their exact chemical compositions for example, their degree of oxidation, these materials may in fact be electrical conductors. These materials will be referred to by their empirical formula, such as "$In_2O_3$" for indium oxide. It will be understood by those versed in this field that the degree of conversion of the metals to the dielectric from may sometimes be somewhat less than the 100% implied by the empirical formula (for example 90% conversion). This partial conversion may be important in obtaining the conductivities need in the conductive layers.

Transparent Panel Structures

As illustrated in FIGS. 1 and 2, the present invention provides a transparent panel 10 made up of a transparent conductive layer 12 in electrical contact with vacuum-deposited bus bar 14. Bus bar 14 is connected through connector 16 and lead 18 into a an electrical circuit. In FIG. 1 this circuit is a ground which is suitable if the panel is designed to serve as a radiation shield. A similar circuit could serve as an antenna, in which case the electrical circuit would be a radio receiver, or the like. Depending upon the shape of the panel and the shape of connector 16, bus bar 14 can serve as a primary electrical connection to the thin film or it can serve as a feeder layer assuring a good electrical connection between the thin film and the remainder of the electrical circuit In FIG. 2, the circuit is a powering circuit which is completed by lead 18', second connector 16' and second vacuum-deposited bus bar 14'. This circuit could serve as a window deicer or defogger.

In both of the cases shown in FIGS. 1 and 2, the transparent conductor layer 12 is supported by a transparent substrate 20 which provides mechanical strength.

The conductive layer 12, bus bar 14 assembly can be incorporated into more involved glazing structures. Representative glazing structure are shown in FIGS. 3 and 4, as 30 and 40.

In FIG. 3, substrate 20, carrying layer 12 and vacuum-deposited bus bars 14 and 14' is laminated to glazing layer 22 via adhesive layer 24. In this case glazing layer 22 is commonly glass, but could be rigid plastic or the like. Adhesive 24 can be any laminating adhesive such as poly (vinylbutyral).

In FIG. 4, structure 40 includes all the elements shown in structure 30, but also includes a second glazing pane 22' and a second layer of adhesive 24', all laminated into a "safety glass" configuration. In this structure, the thinness of the vacuum-deposited bus bars provides the advantage of allowing lamination without localized stresses during lamination.

Conductive Layers

The conductive layers such as 12 in FIG. 1 can be a simple single layer of metal or a conductive metal compound. Metals may be selected from silver, gold, copper, aluminum, nickel, chromium, or the like and alloys thereof. Metal compounds include oxides such as conductive indium oxide or conductive indium-tin oxide, antimony oxide, zinc oxide, zinc-aluminum oxide, tin-aluminum oxide and the like.

To be transparent, a single metal layer is typically from about 10 Å to about 250 Å in thickness and preferably from about 25 Å to about 200 Å. Metal compound layers can be thicker such from about 50 Å to about 1000 Å and especially 100 Å to about 750 Å.

In any case, the conductive layer should be a "conductor" that is a layer with a sheet resistance of less than 1000 ohms/square. In the case of a single metal layer it preferably should have a sheet resistance of from about 0.5 to 25 ohms/square and especially 1 to 20 ohms/square. When there are two metal layers in the conductive film, they should have a contained sheet resistance of from 0.5 to 20 and especially 0.5 to 15 ohms/square. With three or more metal layers, their contained sheet resistance is preferably 0.5 to 15 ohms/square and especially 0.5 to 10 ohms/square. Conductive dielectric layers commonly have sheet resistances of 5 to 500 ohms/square.

The conductive layers 12 in these structures are transparent as that term is defined herein. In many applications and particularly in many automotive window applications, it is desired to use a conductive layer which achieves a high degree of solar energy control by reflecting and absorbing long wavelengths (heat) and transmitting the shorter visible wavelengths (light). This is often accomplished with a conductive layer which is made up of several layers. As shown in structure 50 in FIG. 5, this can include a metal layer 52 bounded on one or both sides by dielectric layers 54 and 56 for reflection minimization, phase matching or the like. This multi-layer conductive layer is in electrical connection with vacuum-deposited bus bar 14 and connector 16. It can also be carried on substrate 20 which can be laminated to glazing sheet 22 with adhesive layer 24 in representative structure 50.

Unexpectedly, vacuum-deposited bus bar 14 can make electrical contact with the multi-layer conductive layer in structure 50 even when it contacts dielectric layer 54 as opposed to metal layer 52. In this regard, vacuum-deposited bus bar 14 does achieve an unexpectedly low resistance connection to the conductive layer irrespective of the conductive layer's configuration either as a primary connection or as a feeder electrode.

Figure 6:
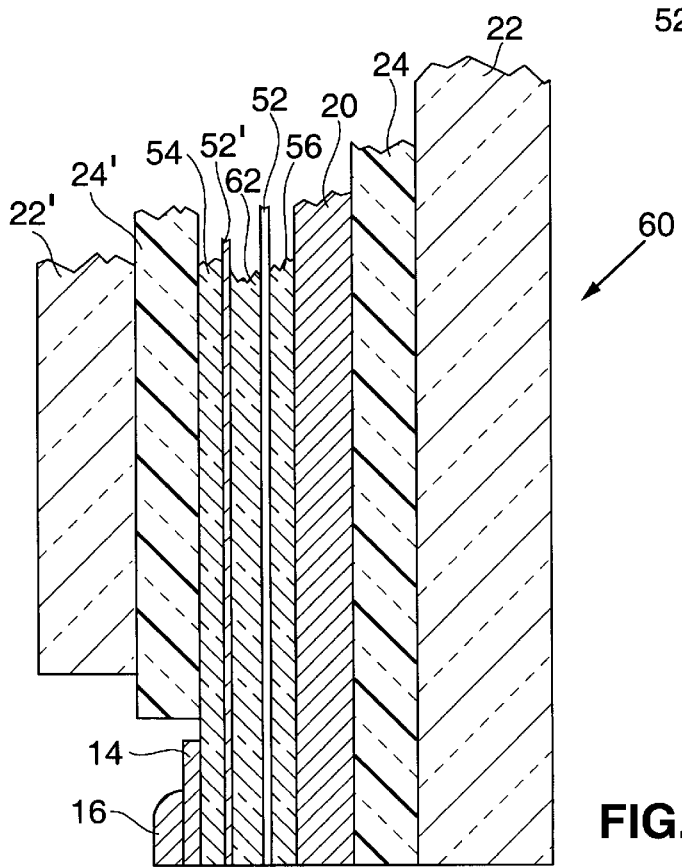
FIG. 6 is a cross-sectional side view of a transparent panel employing the vacuum-deposited bus bars of this invention.

In another glazing structure, structure 60, shown in FIG. 6, the conductive layer can have multiple metal layers 52 and 52' separated by separation layer 62 into a Fabry Perot filter. This structure is particularly effective for giving high degrees of solar control. As shown in FIG. 6, this structure can be further laminated between a pair of glazing sheets 22 and 22' with adhesive layers 24 and 24'.

As embodied in structures 50 and 60 these multilayer conductive layers there may one but also two, three or more two transparent metal layers, each separated from one another by a spacer layer, typically of dielectric, and bounded on one or both outside surfaces by an additional dielectric layer. In theory, there is no limit to the number of transparent metal layers that can be used in these sandwich structures. In practice, however, two to five transparent metal layers are preferred with two or three transparent metal layers being more preferred.

The thickness of the various layers in the preferred multilayer conductive layers is typically controlled to achieve an optimum balance between desired infrared reflectance and desired visible radiation transmittance. The ideal thickness can also depend upon the nature of the transparent metal and dielectric employed.

When there are two transparent metal layers in the conductive layer, to achieve good transparency, each layer is commonly from about 4 to about 40 nanometers (nm) in thickness. In the case of three metal layers, each is from about 3 to about 25 nm. In most case the total thickness of metal is generally from about 12 to about 80 nm. With silver and silver alloyed with up to about 25% w of gold, which constitute preferred transparent metals, excellent results are obtained with two or three layers of metal, each from 4 to 17 nm in thickness especially from about 5 to about 13 nm.

The transparent metal layers may be of equal thickness. This is not a requirement of the present invention. When the transparent metals are sputter-deposited, and this is a preferred method for their production, the thickness of the deposits is a function of the sputtering conditions.

The spacer layers between adjacent transparent metal layers in multilayer conductive layer is between about 40 and about 200 nm in thickness. The preferred thickness selected within this range will often depend upon the index of refraction of the dielectric employed. Spacer layers are preferably from about 60 to about 110 nm and especially from about 70 to about 100 nm in thickness for dielectrics having an index of refraction of from about 1.75 to about 2.2. Materials having an index of refraction within this range include the inorganic dielectrics such as metallic and semimetallic oxides, for example indium oxide, tin oxide, titanium dioxide, silicon dioxide, zinc oxide, bismuth oxide, chromium oxide, aluminum oxide and mixed oxides such as aluminum-tin and indium-tin and the like as well as other inorganic metal compounds and salts, for example zinc sulfide and magnesium fluoride and mixtures there of. Of these materials, preference is given to zinc oxide and indium oxide, tin oxide and mixtures thereof and titanium dioxide. As already noted, the degree of chemical conversion of these materials, such as their degree of oxidation, can play a part in determining their degree of conductivity.

With materials having indices of refraction in the 1.4 to 1.75 range, spacer thickness are somewhat thicker. Suitable thickness in this embodiment are from about 75 to about 200 nm with thicknesses from about 90 to about 175 nm being preferred. Materials having these indices of refraction include hydrocarbon and oxyhydrocarbon organic polymers (1.55–1.65 index of refraction) and fluorocarbon polymers (1.35–1.45 index of refraction).

These multilayer conductive layers and their use as solar materials to pass light but reflect or absorb heat are especially preferred as components of vehicle windshields such as the laminated "safety glass" windshields commonly employed in automobiles. These multilayer conductive layers are typically prepared by sputter depositing and are described in more detail in U.S. Pat. No. 5,510,173 of Pass et al; U.S. Pat. No. 4,337,990 of Fan et al; and U.S. Pat. No. 4,499,745 of Meyer et al, all of which are incorporated herein by reference.

Bus Bars

In accord with this invention, vacuum-deposited bus bars are employed in intimate electrical contact with the conductive layers. These bus bars are formed of a conductive metal, such as copper, aluminum, silver, gold, platinum or an alloy of these metal with one another or with other metals such as nickel, tin or the like. The bus bar itself can have two or more layers of metal. This can be advantageous to provide a protective gold or the like layer on top of silver or other corrodable metal layer. It also can be useful to provide a nucleatin layer or to otherwise facilitate the bond between the bus bar and the conductive layer.

The thickness of the vacuum-deposited bus bar ranges from about 60 Angstroms to about 10,000 Angstroms. Generally, the sputtered bus bar would have a sheet resistance of less that or equal or equal to the sheet resistance of the transparent conductor (i.e. typically <10 ohms/square and preferably <5 ohms/square and <1 ohm/square).

The thickness of the sputtered bus bar can be varied to provide regions of different conductivity. This allows the current introduction into the transparent conductor to be nonuniform. This is useful with heated windshield as it permits the distribution of heat across the surface of the window to be controlled, for example to focus defrosting first in primary viewing areas.

The bus bars can vary in width from about 0.1 mm to as much as 300 mm or more. Typically, they are in the range of from about 1 mm to about 150 mm wide and usually 10 mm to 75 mm.

The nature of the edge of the sputtered bus bar can be affected somewhat by the design of the sputtering source. For example, a relatively sharp edge can be obtained by positioning a mask near the substrate and using a collimation device. (A collimation device is a three dimensional mask which uses a series of parallel tubes to prevent off angle deposited atoms from reaching the substrate). Alternatively, if desired a diffuse graded bus bar edge can be obtained by positioning the sputtering source away from the substrate. (A tapered edge bus bar edge is advantageous in that coating failure during laminating and heating may be reduced.)

Shaped Bus Bars

One advantage of the present invention is the versatility of vacuum deposition and its ability to produce bus bars which are shaped and graduated (tapered) in thickness. The various vacuum deposition methodologies generally involve laying down a layer of material (the bus bar) onto the conductive layer either as the conductive layer moves past the deposition zone or as the deposition zone moves over the conductive layer.

As noted above, particularly in the case of multilayer conductive layers, sputter deposition is an excellent process for producing conductive layers. If this process is used it is often convenient to use it also to produce the bus bars and to do this in the same equipment in which the conductive layer is being laid down. In this case, the bus bars can be laid down immediately after the conductive layer is deposited. In fort, if desired, the bus bar could be laid down in between layers of a multi-layer conductive film.

In the case of automotive glazings, such as windshields, a glass windshield blank can be coated with a conductive layer using the sputter depositer and thereafter bus bars can be sputtered onto opposing edges of the conductive layer on the glass blank. Alternatively, a plastic substrate can be coated with the conductive layer and thereafter the bus bars can be applied. In this case, the plastic substrate is typically a continuous web and the bus bars need to be patterned or shaped to correspond to opposing edges of the windshield. The substrate is cut into pieces corresponding to the windshield shape and laminated into the windshield structure. Representative methods for shaping the bus bars are described below.

It is also possible to vary the thickness of the bus bars. Varying bus bar thickness can be used to vary the conductivity of the connection to the conductive layer. This can give variations in the current passing through various portions of the conductive layer and, in the case of heated windshields and the like focus the heat in certain areas, such as near the windshield wipers where it will be most effective.

Figure 7:
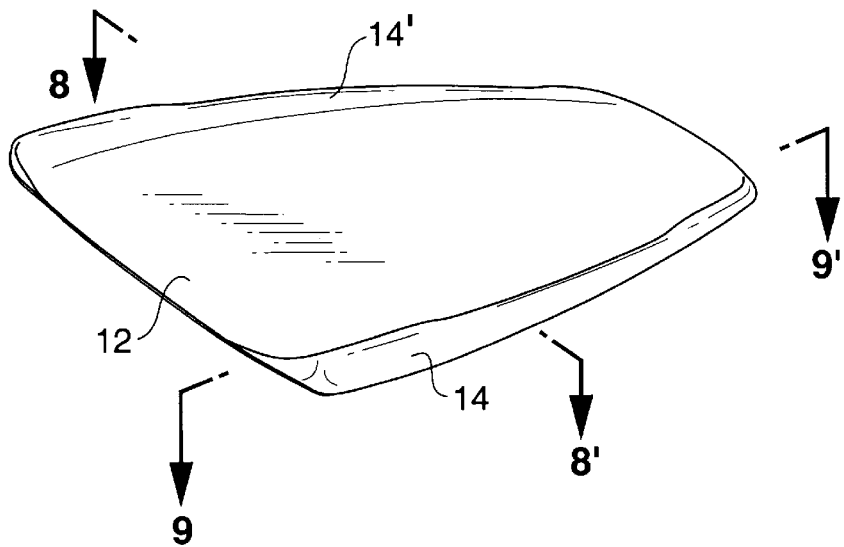
FIG. 7 is a perspective view of a vehicle windshield employing the vacuum-deposited bus bars of this invention and illustrating the locations of the cross-sectional views of this same structure depicted in FIGS. 8 and 9.
Figure 8:
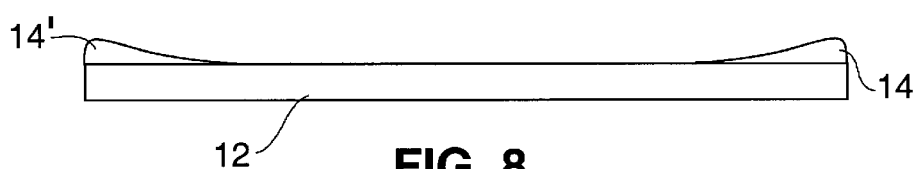
FIG. 8 is a cross-sectional side view of the windshield of FIG. 7 showing one form of tapered bus bar possible with the present invention.
Figure 9:
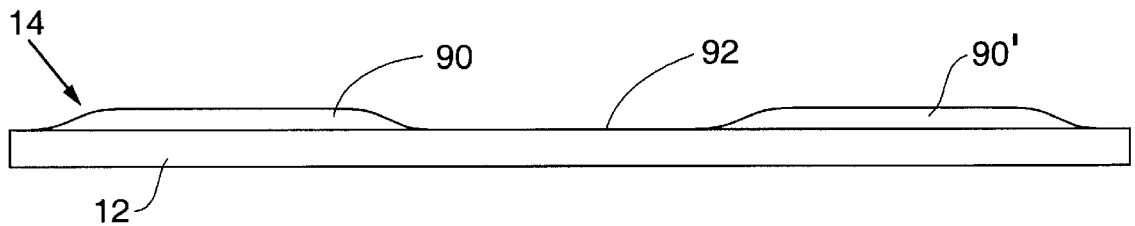
FIG. 9 is a second cross-sectional side view of the windshield of FIG. 7 showing a form of shaped bus bar possible with the present invention.

FIG. 7 shows a typical windshield-shaped conductive layer 12 with bus bars 14 and 14' on opposing edges. Bus bars 14 and 14' are shaped to follow the edges of layer 12. In addition, as shown by cross section $8-8^1$ shown in FIG. 8, the bus bars 14 and 14' can be tapered. As shown in the cross section $9-9^1$ depicted in FIG. 9, the thickness can be varied from thick areas such as 90 and 90' to thinner area such as 92.

Substrates

The materials which are employed as substrates for the bus bar conductive layer assemblies most commonly are substantially transparent plastic (polymer) films, plastic sheets, or sheets of glass, quartz or another inorganic material. Polymer materials and glass sheets are the most common support media.

Polymer materials include classic organic polymers such as polyesters and polyhydrocarbons and fluorocarbon and fluorohydrocarbon materials as well. Representative organic polymers include polyesters such as poly (ethyleneterephthalate) ("PET"), polycarbonates, polyacrylates and methacrylates such as poly(methylmethacrylate) ("PMMA"), poly(ethylene-2,6-naphthalate) ("PEN"), poly (methacrylate), poly(ethylacrylate) and copolymers such as poly(methylmethacrylate-co-ethylacrylate). Fluorocarbon polymers such as teflon can be used as well. Other polymers which have indices of refraction below that of the dielectric coatings in the multi-layer conductive layers may be used, if desired.

Although not a limitation to the practice of this invention, clear, transparent, colorless polymer materials (i.e., plastic sheets, films, or bodies having integrated transmissions over the visual wavelengths of at least about 70% i.e., from about 70% to about 95% without marked absorption or reflection peaks in this range) yield particularly attractive final products.

The polymer substrates are commercially available or can be prepared by various, art-known processes.

These polymer substrates can be presented in any form. These forms include solid bodies, and films. The polymer substrates can be applied or laminated onto other surfaces such as metal or glass.

Processes for Production

Sputter depositing is often used to lay down these bus bars. In early experiments, sputter-deposited bus bars were applied on the top dielectric layer of a transparent dielectric-silver-dielectric-silver-dielectric stack on a polyester substrate. This is a Fabry Perot filter with two silver layers separated from one another and bounded on both sides by indium oxide layers. It was interesting to note that current seems to readily pass from the bus bar through the top dielectric layer, which was about 400 Angstroms in thickness and the cavity dielectric layer about 800 Angstroms to reach both silver layers. Alternatively, the bus bars can be sputtered on the substrate prior to applying the transparent conductive coating or they can be located anywhere within the multi-layer interference coatings. This is useful for protecting the bus bar from interlayer attack (i.e. PVB-induced corrosion). It also assures uniform adhesion of the bus bar to the sputtered coating when in contact with the PVB layer.

There are several approaches for sputtering bus bars which take into account the fact that the bus bars must be located along edges of the conductive layer-coated substrate but must not cover the entire surface of the coated substrate. Four are summarized below:

1) One method involves using a long target of an appropriate metal (Ag, Au, Cu, Al, Ni, Cr, and the like . . . ) with a mask cut to provide metallic conductive downweb stripes. In this approach, the bus bars are directed downweb and are positioned at one or more fixed cross web locations. In this case, the thickness of the bus bar can be graded by adjusting the linespeed or by adjusting the power to the sputtering cathode. (A higher applied power would give a thicker and more conductive bus bar.) In the event the bus bar is applied in-line with one or more layers of the transparent conductor, the linespeed cannot be readily adjusted, since it would affect the thickness of other layers in the transparent conductor.

2) A second method for sputtering cross web bus bars is to have a long target which is switched on and off at specified downweb intervals. The web might need to be stopped momentarily as each bus bar is applied. If a slight curvature is required or nonuniform bar width is desired, then an appropriately cut mask can be provided.

3) A third method for providing bus bars is to use an appropriately cut mask on the sputtering target used to deposit one or more of the metallic layers in the interference filter used as the transparent conductor. Of course in this case, neither the cross web location nor the thickness of the bus bar can be adjusted downweb.

4) A fourth method for applying the bus bar is to use one or more small sputtering targets which are mounted to a cross web positioning device. As the web is transported, the position of the small target./cathode assembly is adjusted to draw curved bus bars as required for specific windshields. By stopping the web and moving the small sputtering source, even cross web bus bars can be applied. The power to the small cathode could be adjusted to obtain graded conductivity along the length of a bus bar, if desired.

Although sputtering is a method of choice for applying bus bars, certainly other vacuum deposition approaches can be used. For example, chemical vapor deposition could be used to deposit silver be providing a vacuum in the chemical vapor deposition zone of $10^{-2}$ to $10^{-3}$ millitor and providing silver at a temperature of 975 to 1100° C., typically high enough to provide a suitable working vapor upon pressure of silver and applying the vapor onto the conductive film with soluble masks and salt, able cooling for the transparent conductor film. Other vacuum deposition methods, including ion vapor deposition, ion plating and plasma vapor deposition can be used.

Returning to sputter-deposition as a method to lay down the conductive layers and to apply the bus bars, these steps can be carried out with conventional sputtering conditions. The conductive metal layer can be deposited using conventional sputtering equipment and methodology.

When the layers of dielectric present in a multilayer conductive layer are very thin, i.e. at the very low end of their thickness, they may be laid down as metal layers and then up-oxidized into a dielectric state. This may be done one layer at a time or may be done with multiple layers at a time. This might be done by laying down the metal for the first dielectric from a first metal cathode followed by laying down the metal for the second or outer dielectric layer from a metal cathode with a magnetron sputterer and an inert sputtering gas such as argon and then converting the laid-down metals to the desired dielectric compounds by reaction with oxygen or mixture of oxygen and nitrogen with optional hydrogen addition.

More commonly, however, the dielectric layers are laid down by direct reactive sputtering. In this method the sputtering cathode is the dielectric metal or alloy of metals depending upon which layer is being formed. The cathode is sputtered using reactive gas (oxygen, nitrogen, and hydrogen) and optionally an inert sputtering gas such as argon to give the desired layer of one or more dielectric compounds.

The thickness of the various layers is controlled by varying the voltage and current fed to the electrode targets, the gas flow rates and, in the case of continuous systems where the substrate and sputtering target move relative to one another, the speed at which the substrate and target move past one another.

If desired, the lay down of the first metal layer or (if present) the dielectric layer under the metal layer can be preceded by a mild preglow treatment of the substrate to improve adhesion.

Figure 10:
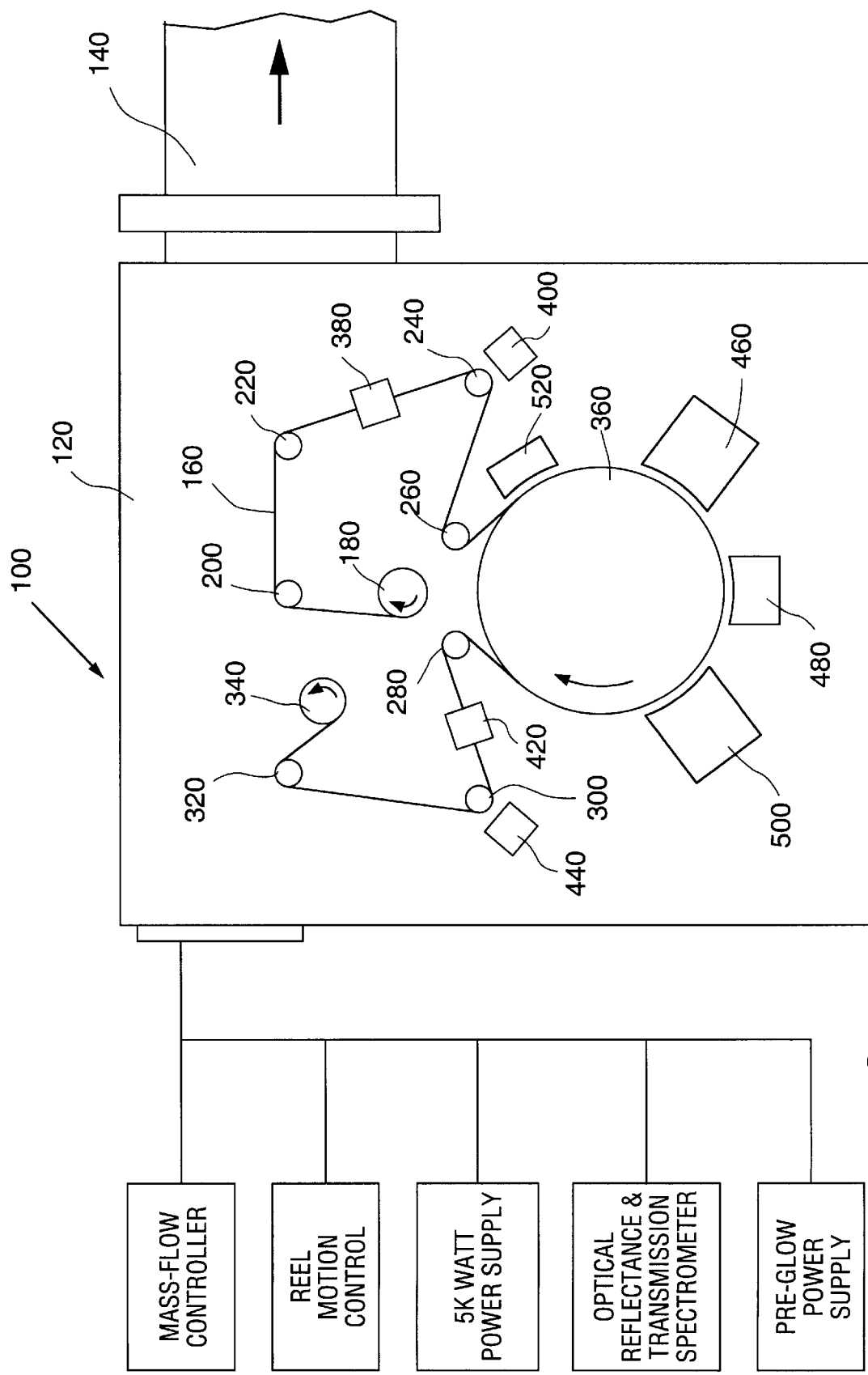
FIG. 10 is a schematic view of one form of sputter-depositing equipment useful for producing structures employing the bus bars of the present invention.

A sputter deposit apparatus suitable for laying down these various conductive layers is shown in FIG. 10. Sputter-depositing is a commercial process for the depositing inorganic materials, metals, oxynitrides, oxides, and the like on surfaces. Representative descriptions of sputter-depositing processes and equipment may be found in U.S. Pat. Nos. 4,204,942 and 4,948,087, which are incorporated by reference.

In sputtering, a voltage is applied to a metal or metal compound sputtering cathode in the presence of a reactive or nonreactive gas to create a plasma. The action of the sputtering gas plasma on the cathode causes atoms of the cathode (target) to be dislodged and to travel and to deposit upon a substrate positioned adjacent to the sputtering source.

Typically the sputtering gas is a noble gas such as krypton or argon or the like. Argon is the most common sputtering gas because of its attractive cost. It is also known in the art to employ from about 1% to about 90% (or even 100% in some cases)of one or more reactive gases as components of a sputtering gas mixture.

When a reactive gas is present, it can cause a metal to be deposited as a compound such as an oxide when an oxygen source is present and the like. This reactive sputtering process is well known and used commercially.

If a multi-layer conductive layer as shown in FIG. 6; the dielectric layers are preferably deposited using a cathode of indium, tin or zinc or the like and a sputtering gas including oxygen, and optionally nitrogen and/or hydrogen to give the desired oxide. The metal layers, including bus bars, are laid down using various metal and metal alloy targets together with an inert sputtering gas.

FIG. 10 shows a continuous web coating sputtering machine. The web coating system is shown as system 100 in FIG. 10. System 100 includes vacuum chamber 120 which is evacuated via line 140. Contained within the chamber 120 is a drive mechanism for moving a sheet of flexible polymer substrate 160 past a series of magnetron sputtering stations 500, 480, and 460. The drive mechanism includes feed roll 180, idlers 200, 220, 240, 260, 280, 300, and 320 and take-up roll 340.

The film passes around chilled idler drum 360 as well. The film passes a pair of monitors for determining its transmittance, 380, and reflectance, 400, before coating and a similar pair of monitors 420 and 440 after coating. This coater is configured to simultaneously sputter coat up to three layers on the web using three separate DC magnetron cathodes 460, 480, 500. To produce a product as shown in FIG. 1., cathode 460 is used to lay down the metal layer; cathode 480 is used to lay down the first dielectric layer and cathode 500 can be used to lay down the second dielectric layer. Also located in the system is a pre-glow station 520 for optional ionized gas cleaning or surface modifying of the substrate before coating. Each of these four stations is isolated from each other in space as a mini-chamber (See U.S. Pat. No. 4,298,444); thereby producing a local environment for the containment of the various plasma gasses. This allows separate processes to be carried out simultaneously at each station with variations in atmosphere from station to station but with minimal cross-contamination among four sources. It should be possible to incorporate a non-sputtering vapor deposition station in a mini-chamber environment, if desired.

To create a conductive layer-bus bar assembly having more than four layers, the film would need to be rerun through the sputtering apparatus of FIG. 10 with appropriate stations activated. To achieve the bus bar coatings which are relatively very thick, compared to the conductive layer, it may be necessary to use multiple stations all set up to deliver the bus bar metal. These stations may need to be equipped with various masks as previously described, to give the desired patterning of the bus bars. As noted, the bus bars can be applied before, during or after the completion of the multilayer conductor layer.

The control and monitoring of the sputtering system are normally accomplished using equipment and sensors which are standard in this type of coating machine. These are shown in FIG. 10. and include: 1) mass flow controllers (MKS) for regulation of gas flow in to the cathode mini-chambers; 2) 5–10 kilowatt DC power supplies (Advanced Energy) for all three sputtering cathodes; 3) an optical monitoring system (Hexatron/Southwall Technologies) which measures both reflectance and transmission of the film over the spectral region from 400 to 2000 nm and 4) a film motion control system (Drivex) which regulates the tension, speed, and distance of the film as it moves through the system.

This invention will be further described by the following Examples. The first Example is provided solely to illustrate the practice of the invention on a transparent flexible plastic substrate and is not to be construed as limiting the invention's scope. The second and third examples illustrate the preparation of bus bars using methods not in accordance with this invention. These are provided for comparison purposes.

In all cases the transparent conductor was a five layer stack consisting of $In_2O_3$/AgN 7 nm/$In_2O_3$/AgN 8 nm/$In_2O_3$. It was on a substrate. The substrate was 2 mil PET. This film is marketed by Southwall Technologies as XIR75. These examples show that much more robust electrically heatable conductive laminates are obtained when sputtered bus bars are used rather than more conventional bus bar technologies.

EXAMPLE 1
(sputtered bus bars):

A 13.5 inch wide polyester film carrying the conductive layer just described was coated with a pair of 3.5 inch wide silver bus bars in a laboratory roll coater. The bus bars were 4.5 inches apart and ran downweb along the substrate. The two bus bars were applied from a single silver target which was masked in the center to provide the transparent region between the two electrodes. The bus bars were about 100 nm thick.

A 1.5 by 6 inch safety glass laminate was prepared by inserting the coated plastic film with sputtered bus bars between two 15 mil plies of PVB (i.e. RB11 Saflex manufactured by Solutia). The conductive interlayer was then placed between two 2.1 mm thick pieces of float glass and bonded in a Carver (model 2518) heated press. The laminating conditions in the Carver Press were ramping up for 20 minutes from room temperature to 120° C. followed by 30 minutes at the constant temperature of 120°. The pressure was set to about 80 lbs/in$^2$.

The resistance between the bus bars was 18.9 Ohms prior to providing power to the laminate. The contact between the bus bars across the transparent coating could be made repeatedly with consistent resistance and requiring very low pressure between the leads and the bus bar. The laminate was powered at 12.5 Volts and 0.8 Amps (current flowing in transverse coating machine direction) to achieve a wattage of 1.5 Watts/in$^2$. At this power the resistance between the bus bars was a constant 15.6 Ohms (5.3 Ohms/sq) and the vertically mounted unit reached temperatures as high as of 82° C. The unit operated at this condition continuously in excess of 2 months. The 5.3 Ohms/sq sheet resistance measured across the bus bars is basically identical to the sheet resistance of the transparent coating only, as measured with a contactless probe. This indicates no additional resistance caused by the bus bar-conductive film coating interface.

COMPARATIVE EXAMPLE 2
(Metal foil bus bars):

Bus bars were made from 3M #1345 EMI shielding tape. This is an embossed tin-plated copper foil with "conductive-through-adhesive". This tape is 1.4 mil thick, 0.5 inches wide and has a resistance of 0.001 Ohms/square. Two 3.5 inch long strips of this tape were placed parallel to each other, 4 inches apart with the adhesive sticking to the transparent coating.

A 3 by 5 inch safety glass laminate was prepared by inserting the conductive layer-coated film with the taped bus bars between two 15 mil plies of conditioned PVB (i.e. AR11 Saflex manufactured by Solutia). The conductive interlayer was then placed between two 2.6 mm thick pieces of float glass and bonded in a lab size autoclave (WSS industries, 1983). The laminating conditions in the autoclave were ramping up for 35 minutes from room temperature to 12° C. at 12 psi pressure, followed by 20 minutes at a constant temperature of 12° C. and 180 psi. After a ramp down from 12° C. to 50° C. at 180 psi, the sample was removed from the autoclave.

The resistance between the bus bars was 26 Ohms prior to providing power to the laminate. The laminate was powered at 13.8 Volts and 1.3 Amps to achieve a wattage of 1.5 Watts/in$^2$. At this power the resistance between the bus bars was 10.6 Ohms (i.e. average of 8.0 Ohms/sq) and the vertically mounted unit reached temperatures as high as of 104° C. The unit was continuously operated at 13.8 V, until power induced arcs beneath the embossed bus bar or high temperatures in that area slowly increased the resistance between the bus bars. The unit failed after about 7 days.

The average sheet resistance of 8.0 Ohms/sq across the bus bars is much higher than the sheet resistance of the transparent coating (about 5.3 Ohms/sq), indicating a significant electrical resistance at the interface between the bus bar and the coating.

COMPARATIVE EXAMPLE 3
(Silver epoxy bus bars)

Bus bars were made by applying a thin coat of silver epoxy (Eccocoat C 225-3 from Emerson&Cuming) directly onto the conductive-layer coated film. The epoxy was cured at about 80° C. for 20 minutes. The shape of the applied bus bar was a "T" on each side of the laminate with a linewidth of about ⅜ inches. The horizontal bars of the two "T's" were parallel to each other at a distance of 3.5 inches. The vertical bars of the "T's" were facing the outside of the laminate and served as tabs for electrical connection. The conductance of the Eccocoat depends on the thickness of the coat, but was on the order of 0.5 Ohms/sq.

A 2 by 5 inch safety glass laminate was prepared by inserting the film with the Eccocoat bus bars between two 15 mil plies of PVB (i.e. RB11 Saflex manufactured by Solutia). The conductive interlayer was then placed between two 3.3 mm thick pieces of float glass and bonded in a Carver (model 2518) heated press. The laminating conditions in the Carver Press were ramping up for 20 minutes from room temperature to 120° C. followed by 30 minutes at the constant temperature of 120° C. The pressure was set to about 80 lbs/in$^2$.

The resistance between the bus bars prior to providing power to the laminate was about 400 Ohms. The resistance was fluctuating probably due to the embrittlement/delamination of the Eccocoat caused by the mechanical stress exerted during the Carver press cycle and handling. Up to 20 Volts were applied to the laminate with a resulting current of 0.03 Amps to achieve a wattage of 0.09 Watts/in$^2$. At this power the resistance between the bus bars was 670 Ohms (i.e. average of 381 Ohms/sq). The unit was considered to be unsuitable and not further investigated, since the resistance of the bus bar-conductor interface was too high and had increased with power.

What is claimed is:

1. In a transparent panel comprising a transparent electrically conductive layer connected through an electrical contact to an external electrical circuit, the improvement comprising a vacuum-deposited metal layer as the electrical contact.

2. The transparent panel of claim 1 additionally comprising a transparent substrate upon which the electrically conductive layer is carried.

3. The transparent panel of claim 2 wherein the transparent substrate is a flexible substrate.

4. The transparent panel of claim 3 wherein the flexible substrate is a plastic film substrate.

5. The transparent panel of claim 2 wherein the transparent substrate is a rigid substrate.

6. The transparent panel of claim 5 wherein the rigid substrate is a glass substrate.

7. The transparent panel of claim 1 wherein the vacuum-deposited metal layer is a vapor-deposited metal layer.

8. The transparent panel of claim 1 wherein the vacuum-deposited metal layer is a sputter-deposited metal layer.

9. The transparent panel of claim 1 wherein the transparent electrically conductive layer comprises a sputter-deposited conductive layer.

10. The transparent panel of claim 9 wherein the sputter-deposited conductive layer comprises a sputter-deposited conductive metal layer.

11. The transparent panel of claim 9 wherein the sputter-deposited conductive layer comprises a sputter-deposited conductive metal oxide layer.

12. The transparent panel of claim 1 wherein the transparent electrically conductive layer is part of a multilayer solar energy control structure.

13. The transparent panel of claim 12 wherein the multilayer solar energy control structure comprises one or more sputter-deposited metal layers sandwiched between sputter-deposited metal oxide layers.

14. The transparent panel of claim 1 wherein the transparent electrically conductive layer is an electromagnetic radiation shield and wherein the external electrical circuit comprises a ground.

15. The transparent panel of claim 1 wherein the transparent electrically conductive layer is a resistance heating element and wherein the external electrical circuit comprises a resistance heating element-powering power supply.

16. The transparent panel of claim 1 wherein the transparent electrically conductive layer is a signal-receiving antenna and wherein the external electrical circuit comprises means for processing said signal.

17. In a window glazing unit containing a transparent electrically conductive electrical resistance heating layer connected through an electrical contact to an electrical power source, the improvement comprising a vacuum-deposited metal layer as the electrical contact.

18. The window glazing unit of claim 17 additionally comprising a transparent substrate upon which the electrically conductive layer is carried.

19. The window glazing unit of claim 18 wherein the transparent substrate is a flexible substrate and wherein the glazing unit additionally comprises a glazing sheet to which the resistance heating layer and transparent flexible substrate are laminated.

20. The window glazing unit of claim 19 wherein the flexible substrate is a plastic film substrate.

21. The window glazing unit of claim 18 wherein the transparent substrate is a rigid substrate.

22. The window glazing unit of claim 21 wherein the rigid substrate is a glass substrate.

23. The window glazing unit of claim 17 wherein the vacuum-deposited metal layer is a vapor-deposited metal layer.

24. The window glazing unit of claim 17 wherein the vacuum-deposited metal layer is a sputter-deposited metal layer.

25. The window glazing unit of claim 17 wherein the transparent electrically conductive layer comprises a sputter-deposited conductive layer.

26. The window glazing unit of claim 25 wherein the sputter-deposited conductive layer comprises a sputter-deposited conductive metal layer.

27. The window glazing unit of claim 25 wherein the sputter-deposited conductive layer comprises a sputter-deposited conductive metal oxide layer.

28. The window glazing unit of claim 17 wherein the transparent electrically conductive layer is part of a multilayer solar energy control structure.

29. The window glazing unit of claim 28 wherein the multilayer solar energy control structure comprises one or more sputter-deposited metal layers sandwiched between sputter-deposited metal oxide layers.

30. The window glazing unit of claim 17 wherein the transparent electrically conductive layer is an electromagnetic radiation shield and wherein the external electrical circuit comprises a ground.

31. The window glazing unit of claim 17 wherein the transparent electrically conductive layer is a resistance heating element and wherein the external electrical circuit comprises a resistance heating element-powering power supply.

32. The window glazing unit of claim 17 wherein the transparent electrically conductive layer is a signal-receiving antenna and wherein the external electrical circuit comprises means for processing said signal.

33. A laminated window glazing comprising a pair of rigid glazing sheets separated by a transparent electrically conductive layer connected through an electrical contact to an external electrical circuit, said electrical contact comprising a vacuum-deposited metal layer.

34. In a vehicle windshield containing a transparent electrically conductive electrical resistance heating layer connected through an electrical contact to an electrical power source, the improvement comprising a vacuum-deposited metal layer as the electrical contact.

35. The vehicle windshield of claim 34 comprising a uniform thickness vacuum-deposited metal layer as the electrical contact.

36. The vehicle windshield of claim 34 comprising a variable thickness vacuum-deposited metal layer as the electrical contact.

37. The vehicle windshield of claim 34 wherein the vacuum deposited metal layer is a sputter deposited metal layer.

38. A method for producing a transparent panel comprising a transparent electrically conductive layer connected through an electrical contact to an external electrical circuit, the method comprising vacuum-depositing a metal layer as the electrical contact.

39. The method of claim 38 wherein the vacuum depositing is vapor depositing.

40. The method of claim 38 wherein the vacuum depositing is sputter depositing.

\* \* \* \* \*